(12) United States Patent
Kim

(10) Patent No.: US 9,105,538 B2
(45) Date of Patent: Aug. 11, 2015

(54) DYNAMICALLY CONFIGURABLE PHOTOVOLTAIC CELL ARRAY

(76) Inventor: Moon J. Kim, Wappingers Falls, NY (US)

( * ) Notice: Subject to any disclaimer, the term of this patent is extended or adjusted under 35 U.S.C. 154(b) by 928 days.

(21) Appl. No.: 13/159,488

(22) Filed: Jun. 14, 2011

(65) Prior Publication Data

US 2012/0319225 A1 Dec. 20, 2012

(51) Int. Cl.
 *H01L 27/146* (2006.01)
 *H01L 31/02* (2006.01)
(52) U.S. Cl.
 CPC .... *H01L 27/14609* (2013.01); *H01L 31/02021* (2013.01); *Y02E 10/50* (2013.01)
(58) Field of Classification Search
 CPC .................. H01L 27/14609; H01L 31/02021; Y02E 10/50
 USPC .................. 250/203.4, 208.1; 126/587, 615; 340/425.5
 See application file for complete search history.

(56) References Cited

U.S. PATENT DOCUMENTS

| | | | |
|---|---|---|---|
| 8,560,140 B2 * | 10/2013 | Winkler et al. | 700/298 |
| 8,746,232 B2 * | 6/2014 | Kanai | 126/587 |
| 2005/0212957 A1 * | 9/2005 | Wu | 348/372 |
| 2005/0248673 A1 * | 11/2005 | Fowler | 348/308 |
| 2009/0301687 A1 * | 12/2009 | Watts | 165/48.2 |

* cited by examiner

*Primary Examiner* — Seung C Sohn
(74) *Attorney, Agent, or Firm* — Maxine L. Barasch; Keohane & D'Alessandro, PLLC

(57) ABSTRACT

Embodiments of the present invention relate to photovoltaic cells. Specifically, the present invention relates to photovoltaic (PV) cells configurable for energy conversion and imaging. In a typical embodiment, each photovoltaic cell (PV) in the photovoltaic array is divided into a pixel-based array. Each photovoltaic cell is coupled to a set of switches and the photovoltaic cell is dynamically configured for energy conversion or imaging based on the settings of at least one of the switches.

13 Claims, 9 Drawing Sheets

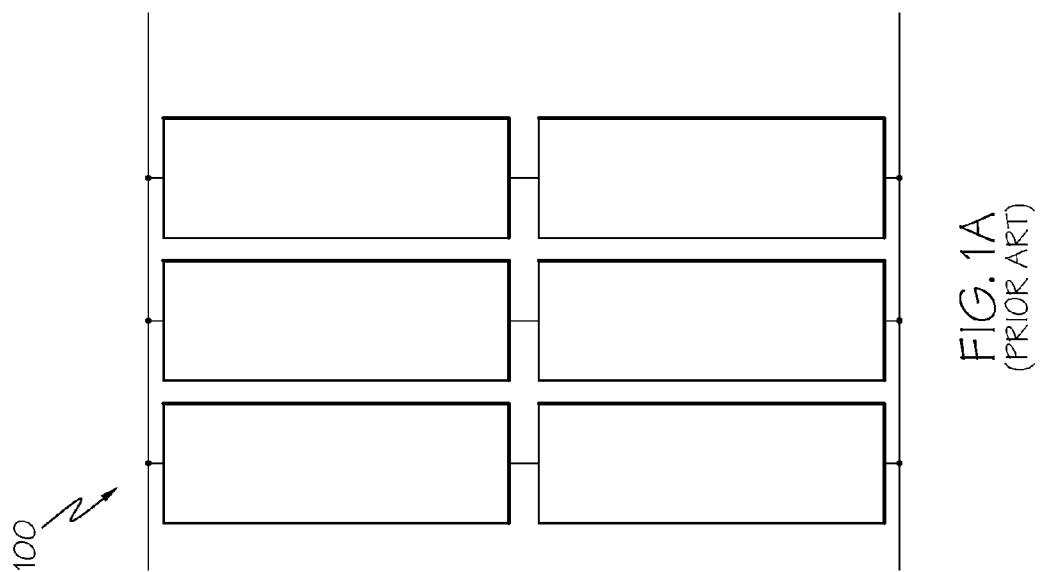

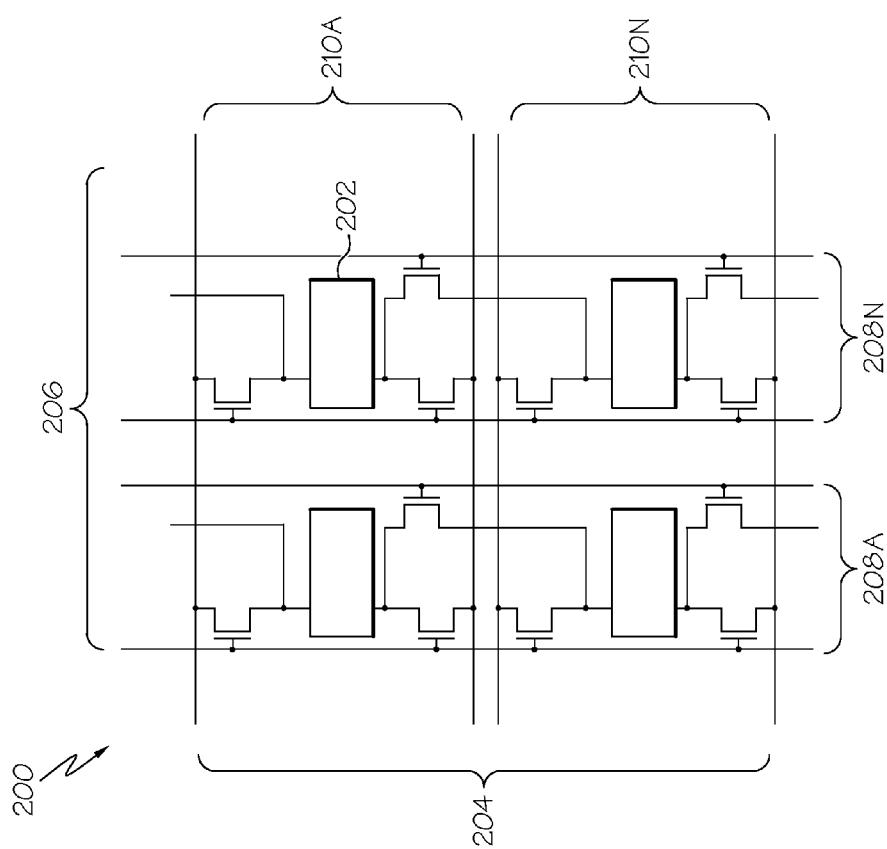

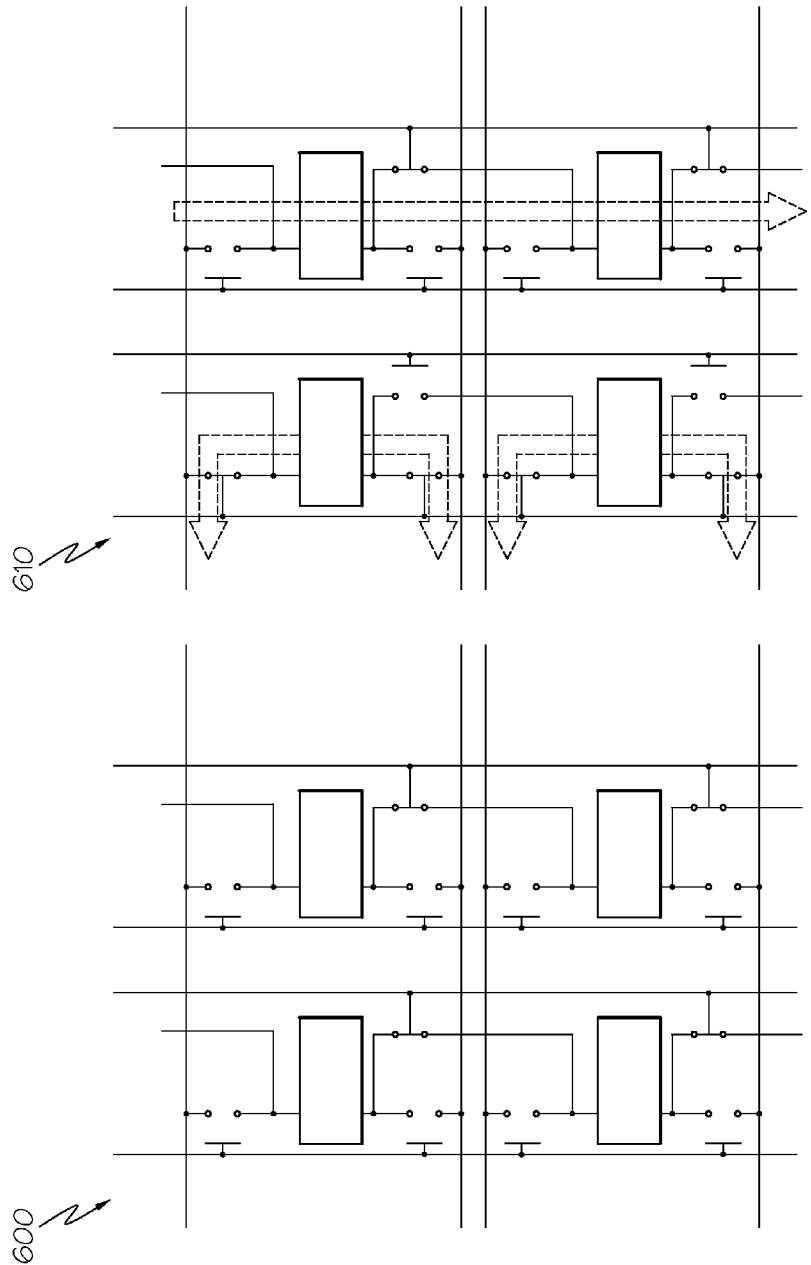

US 9,105,538 B2

DYNAMICALLY CONFIGURABLE PHOTOVOLTAIC CELL ARRAY

FIELD OF THE INVENTION

In general, the present invention relates to photovoltaic cells. Specifically, the present invention relates to dynamic photovoltaic cells configurable for energy conversion and imaging.

BACKGROUND OF THE INVENTION

Autonomous electrical powering and performance have become important topics in recent years. One way of achieving the energy needed to power a system is by using photovoltaic cells that deliver electrical power converted from the incoming light. A photovoltaic cell is a solid state electrical device that converts the energy of light directly into electricity by the photovoltaic effect. Imaging is done using a grid of light sensitive cells or pixels that are capable of producing an electrical charge proportional to the amount of light they receive. There is a constant desire for more energy-efficient and higher-performing imagers.

SUMMARY OF THE INVENTION

In general, embodiments of the present invention relate to photovoltaic cells. Specifically, the present invention relates to photovoltaic (PV) cells configurable for energy conversion and imaging. In a typical embodiment, a photovoltaic (PV) cell is divided into a pixel-based array. A set (at least one) of switches is used to control whether the PV cell is dynamically configured for energy conversion or imaging.

A first aspect of the present invention provides a dynamically configurable photovoltaic cell, comprising: a photovoltaic cell, wherein the photovoltaic cell is coupled to a set of switches and the photovoltaic cell is dynamically configured for energy conversion or imaging based on the settings of at least one of the switches.

A second aspect of the present invention provides a photovoltaic array comprising: a plurality of the dynamically configurable photovoltaic cells, wherein each of the photovoltaic cells in the photovoltaic array is coupled to a set of switches and the photovoltaic cell is dynamically configured for energy conversion or imaging based on the settings of at least one of the switches.

A third aspect of the present invention provides an imager, comprising: an array of photovoltaic cells, wherein each photovoltaic cell is divided into at least one pixel along an array of pixels; and a set of switches coupled to each photovoltaic cell, wherein each photovoltaic cell is dynamically configured for imaging or energy conversion based on the settings of at least one of the switches.

A fourth aspect of the present invention provides a method for providing an imager, comprising: providing an array of photovoltaic cells, wherein each photovoltaic cell is divided into at least one pixel along an array of pixels; and providing a set of switches coupled to each photovoltaic cell, wherein each photovoltaic cell is dynamically configured for imaging or energy conversion based on the settings of at least one of the switches.

BRIEF DESCRIPTION OF THE DRAWINGS

These and other features of this invention will be more readily understood from the following detailed description of the various aspects of the invention taken in conjunction with the accompanying drawings in which:

FIG. 1A depicts a conventional large area static photovoltaic cell array.

FIG. 2 depicts a photovoltaic and imaging cell array according to an embodiment of the present invention.

FIG. 6 depicts a photovoltaic cell default power up configuration according to an embodiment of the present invention.

Figure 3A:
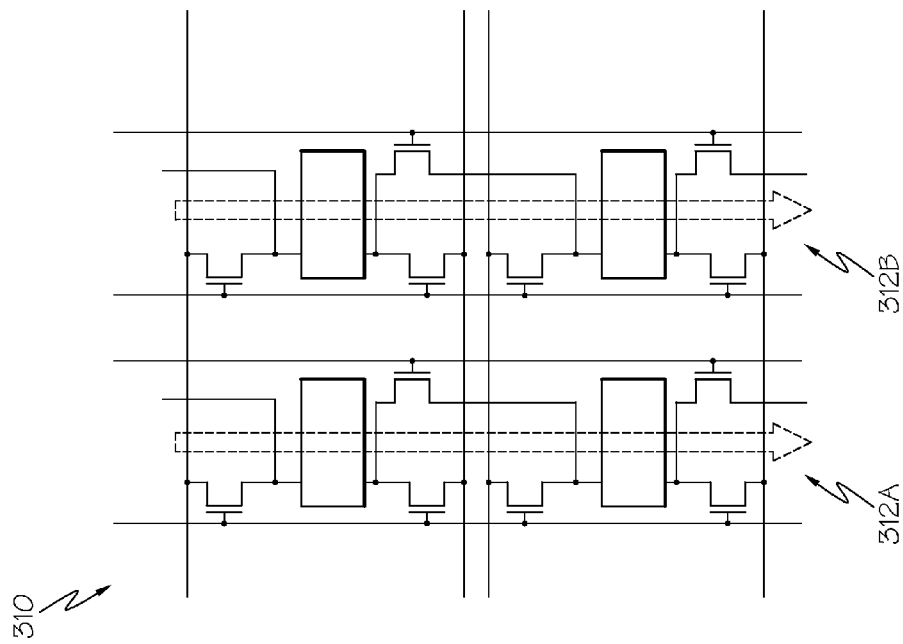
FIG. 3 depicts a photovoltaic energy conversion and imaging according to an embodiment of the present invention.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

Illustrative embodiments will now be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or rectify "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

A photovoltaic cell (or photoelectric cell) is a solid state electrical device that converts the energy of light directly into electricity by the photovoltaic effect. The photovoltaic effect is the process through which a photovoltaic (PV) cell converts sunlight into electricity. Sunlight is composed of photons which contain different amounts of energy that correspond to the different wavelengths of the solar spectrum. When photons strike a PV cell, they may be reflected or absorbed, or they may pass right through. The absorbed photons generate electricity.

An imager consists of an array of pixels arranged in rows and columns. An imager begins by illuminating the target image with a light source. When a pixel or column of pixels is being scanned, an image sensor detects the reflected or inflicted light from the illumination system and generates an analog signal with varying voltage that represents the intensity (or lack of) of the reflection or infliction. An analog-to-digital converter converts the analog signal to a digital signal which is then used to store or recreate the image.

As indicated above, embodiments of the present invention relate to photovoltaic cells. Specifically, the present invention relates to an array of dynamic photovoltaic (PV) cells configurable for energy conversion and imaging. In a typical embodiment, each photovoltaic cell (PV) in the photovoltaic array is divided into at least one pixel along a pixel-based array. Each photovoltaic cell is coupled to a set of switches and the photovoltaic cell is dynamically configured for energy conversion or imaging based on the settings of at least one of the switches.

Referring now to FIG. 1A, a conventional large area static photovoltaic cell array is depicted. Photovoltaic cell array 100 is shown. Photovoltaic (PV) cells are used extensively to generate electric power from light energy. The photons present in incident sunlight are absorbed within the semiconducting material of the PV cell. This means that the energy of the absorbed light is transferred to the semiconductor. The energy knocks electrons loose, allowing them to flow freely through the material to produce electricity. Presently, photovoltaic cell arrays are widely used in energy conversion arrangements such as solar panels, for example.

Figure 8:
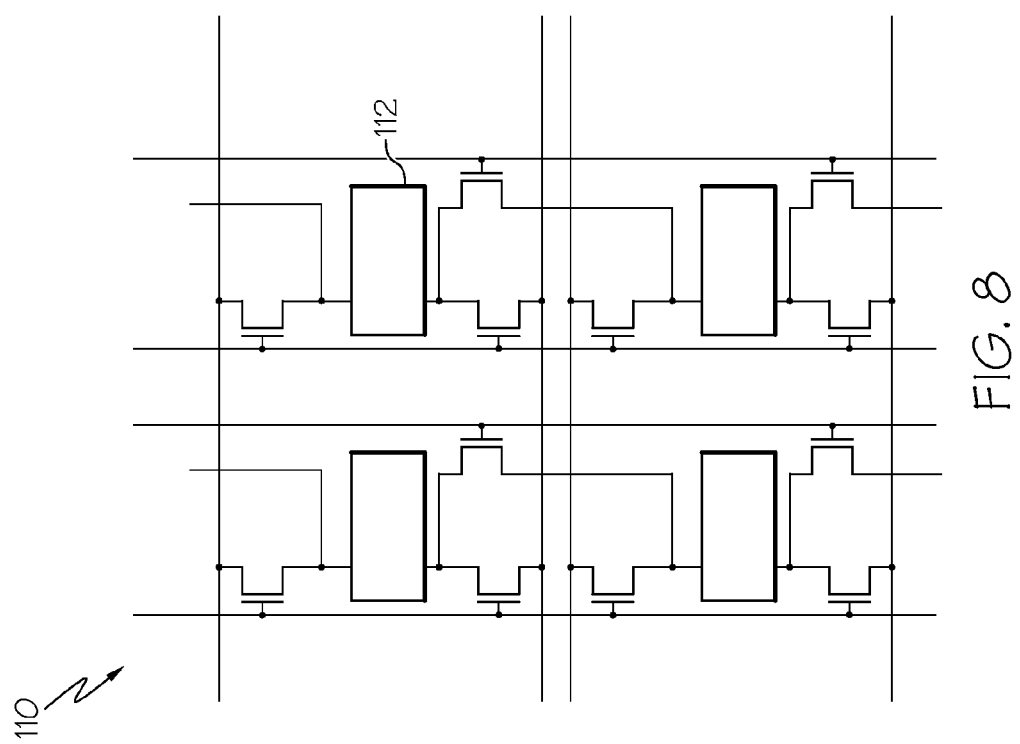
FIG. 8 depicts a dynamic pixel-based photovoltaic and imaging cell array according to an embodiment of the present invention.

FIG. 8 depicts a dynamic pixel-based photovoltaic and imaging cell array according to an embodiment of the present invention. Photovoltaic and imaging cell array 110 is shown as an array of PV cells. PV cell 112 is highlighted. PV cell 112 can be dynamically configured as a conventional PV cell (for energy conversion) or as an imager.

FIG. 2 depicts a photovoltaic and imaging array according to an embodiment of the present invention. PV and imaging cell array 200 includes PV cell 202. Row select signal 204, row read 210A-N, column select signal 206, and column read 208A-N are shown. There are three switches per PV cell. The switches allow electrical configuration so that the cell can be an imager or a conventional, energy-generating PV cell. At each PV cell, the left two switches are connected when the PV cell is to be used as an imager. The right switch is exclusively turned on when the PV cell is to be used as an energy-generating PV cell.

Addressing of PV and imaging cell array 200 is done by direct addressing of rows and columns. The approach has the advantage of flexibility when accessing the cell array. Row select signal 204 and column select signal 206 control which PV cell is to be accessed.

Figure 3B:
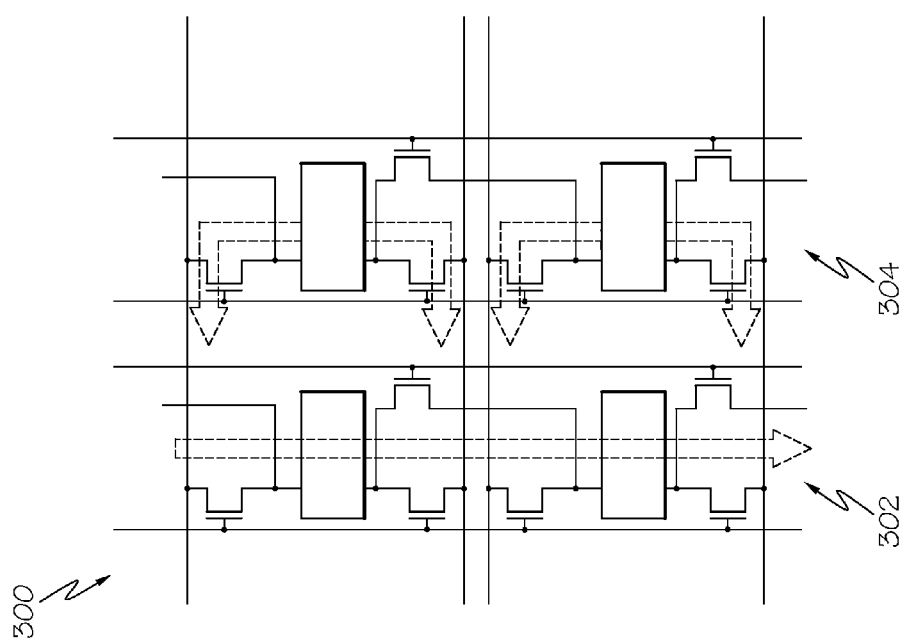

FIG. 3 depicts a photovoltaic energy conversion and imaging according to an embodiment of the present invention. A controller controls the PV and imaging cell array. The controller is responsible for controlling the configuration of each PV cell in the cell array. Other circuitry required for the array of PV cells to function orderly is included in the controller. PV and imaging cell array 300 includes columns 302 and 304. The PV cells of column 302 are dynamically configured to harvest energy, which in turn powers the electronic circuitry. Column 304 is configured for imaging. PV cells in column 304 can be read out sequentially or in parallel.

PV and imaging array 310 includes columns 312A-B. The PV cells in both columns are dynamically configured for energy conversion. To generate energy, electrons are liberated by absorbing energy from the received light. The freed electrons drift to a node and form a current through the cell. The current is drawn off for use.

Figure 4:
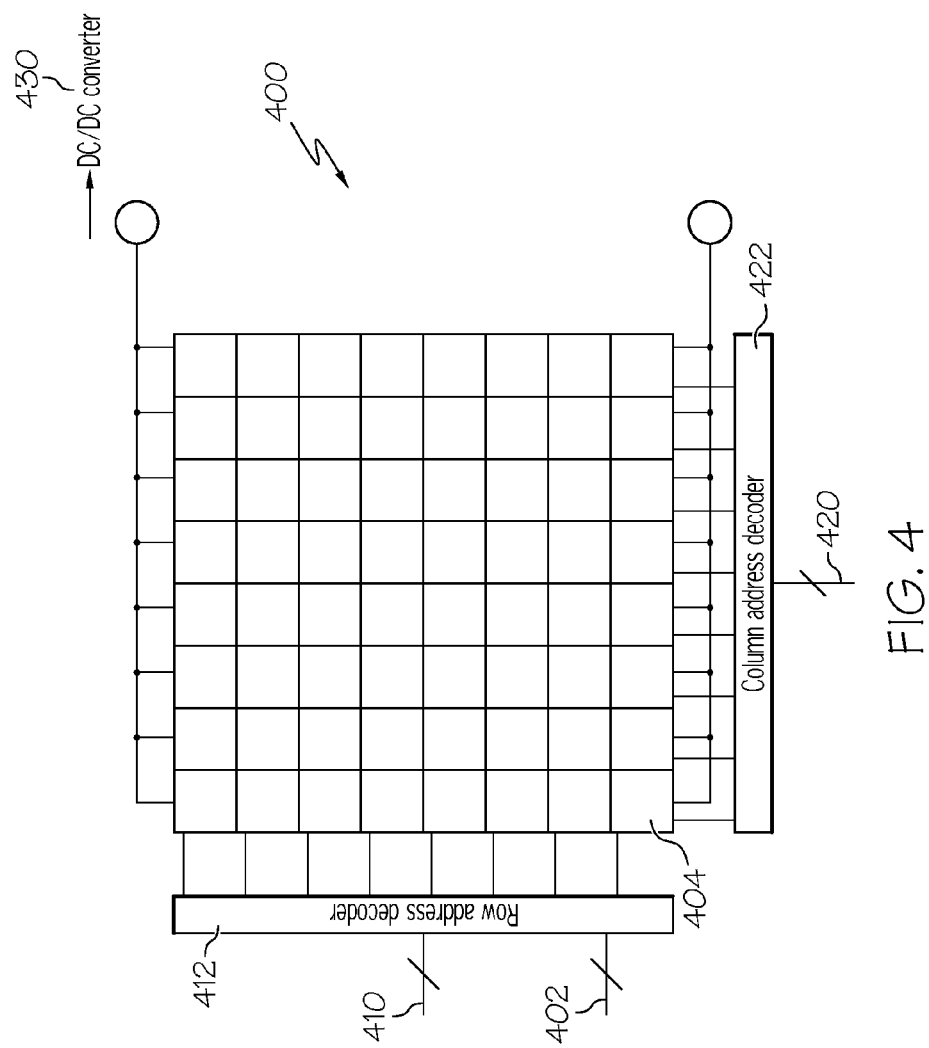
FIG. 4 depicts a photovoltaic and imaging cell array diagram according to an embodiment of the present invention.
Figure 5B:
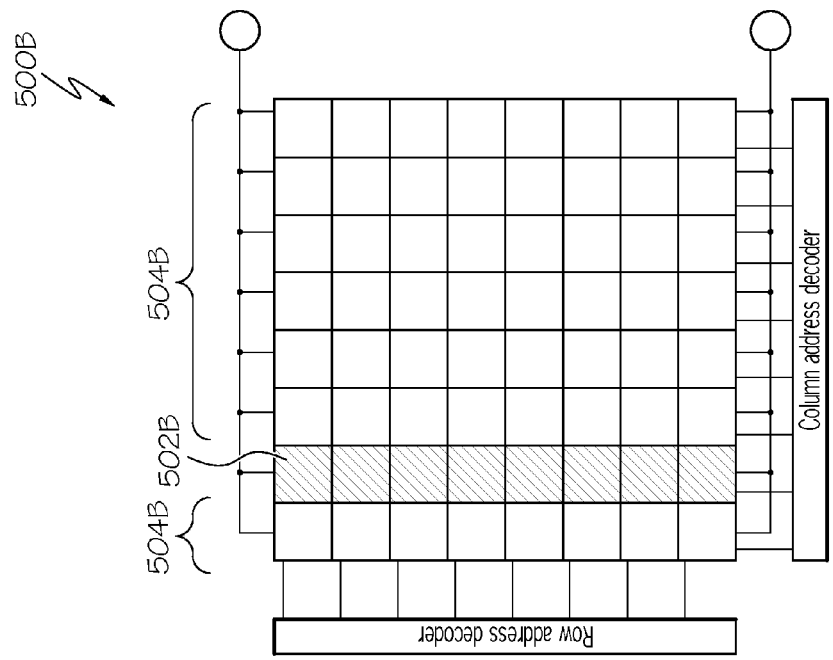
FIG. 5 depicts a sensor readout and photovoltaic energy conversion progress according to an embodiment of the present invention.
Figure 5A:
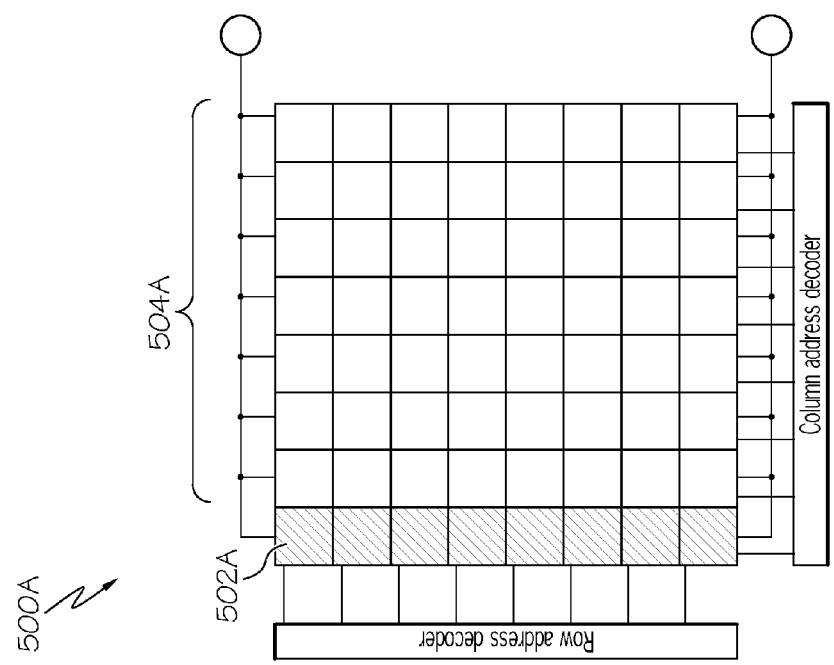
Figure 5D:
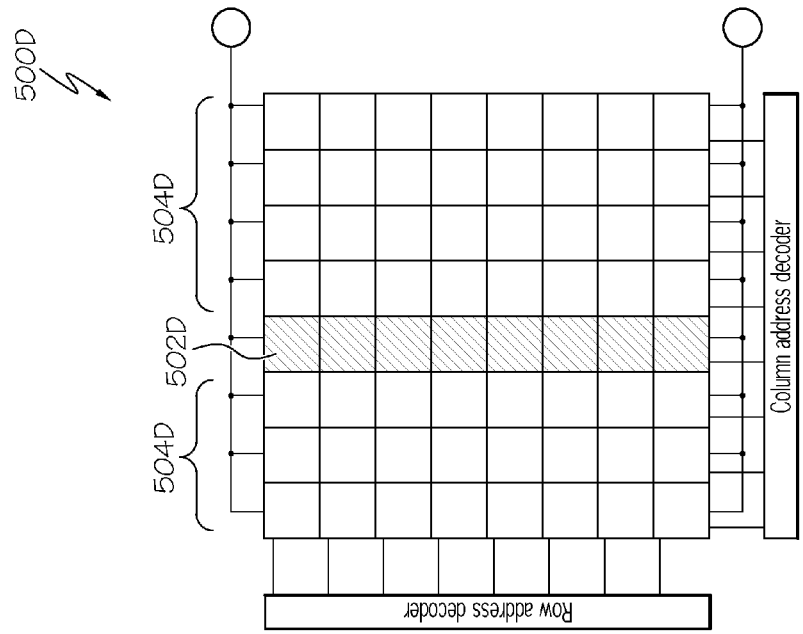
Figure 5C:
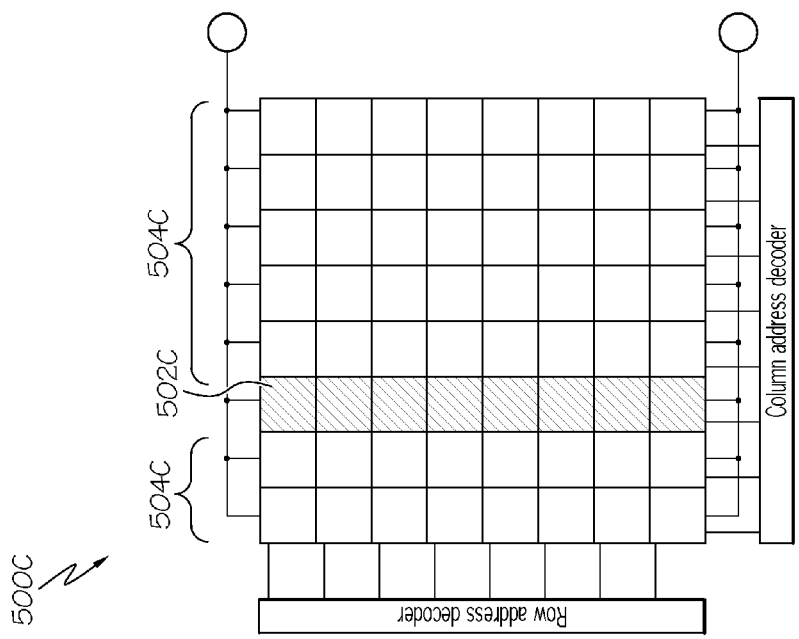

FIG. 4 depicts a photovoltaic and imaging cell array diagram according to an embodiment of the present invention. PV and imaging cell array 400 is coupled to sensor input/output (I/O) 402. Sensor I/O 402 provides a communication link to the array. PV cell 404 is highlighted. PV and imaging cell array 400 is coupled to row address decoder 412 and column address decoder 422. Address decoders allow direct addressing of rows and columns. Row address decoder 412 selects rows in PV and imaging array 400. Column address decoder 422 selects columns in PV and imaging array 400.

In PV and imaging array 400, pixel data is read from the location selected by row address decoder 412 and column address decoder 422. The location is identified by row address 410 and column address 420. The pixel data is outputted to an analog-to-digital converter of the readout system through sensor I/O 402. Other columns that are not read out are connected to DC/DC converter. DC/DC converter 430 is an electronic circuit configured to convert a source of direct current (DC) from one voltage level to another by storing the input energy temporarily and then releasing that energy to the output at a different voltage to be used as a power supply.

FIG. 5 depicts sensor readout and photovoltaic energy conversion progress according to an embodiment of the present invention. The readout process allows the full image to be progressively read out from the PV imaging array. The process is shown using PV and imaging cell arrays 500A-D.

PV and imaging cell array 500A shows sensor readout 502A and PV energy conversion 504A. The PV cells in column 1 are dynamically configured for imaging and activated for sensor readout 502A. The remaining PV cells in PV and imaging cell array 500A are dynamically configured for energy conversion 504A.

PV and imaging cell array 500B shows sensor readout 502B and PV energy conversion 504B. The PV cells in column 2 are dynamically configured for imaging and activated for sensor readout 502B. The remaining PV cells in PV and imaging cell array 500B are dynamically configured for energy conversion 504B.

PV and imaging cell array 500C shows sensor readout 502C and PV energy conversion 504C. The PV cells in column 3 are dynamically configured for imaging and activated for sensor readout 502C. The remaining PV cells in PV and imaging cell array 500C are dynamically configured for energy conversion 504C.

PV and imaging cell array 500D shows sensor readout 502D and PV energy conversion 504D. The PV cells in column 4 are dynamically configured for imaging and activated for sensor readout 502D. The remaining PV cells in PV and imaging cell array 500D are dynamically configured for energy conversion 504D.

FIG. 6 depicts a photovoltaic cell default power up configuration according to an embodiment of the present invention. PV cell 600 is prior to default power up sequence. PV cell 610 shows the cell after default power up is executed. Without any power, PV cell switches are configured for PV generation by using default-on switch. Pixel connected switches are default-off switches. After the PV cell generates enough power for the controller, then the controller will actively turn on default-off switches and turn off default-on switches for imaging purposes. The cell switches can be implemented by using different types of transistors such as PFET (Positive Channel Field Effect Transistor) for default-on and NFET (Positive Channel Field Effect Transistor) for default-off.

Figure 7:
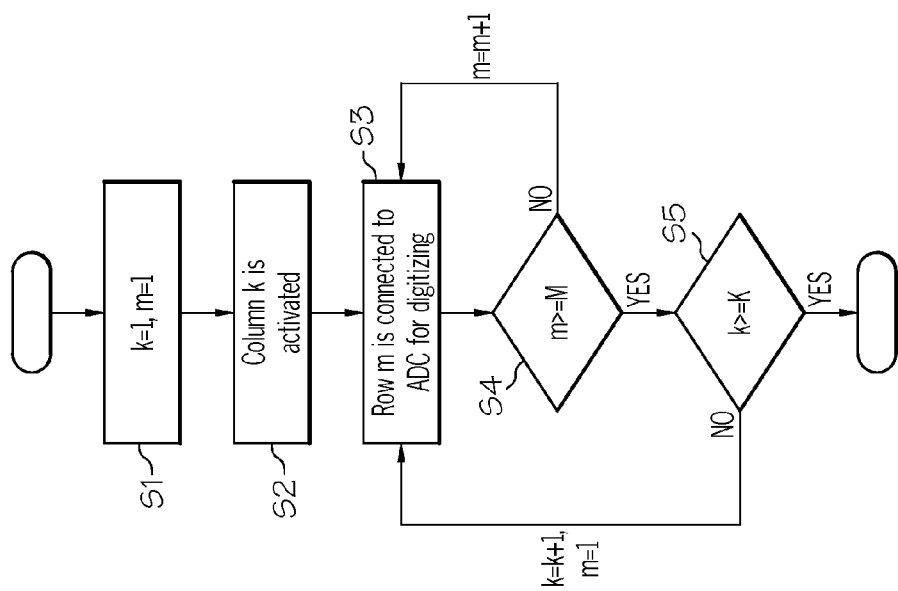
FIG. 7 depicts an imaging flow diagram according to an embodiment of the present invention.

FIG. 7 depicts an imaging flow diagram according to an embodiment of the present invention. A PV and imaging array having K columns and M rows is assumed. In step S1, k and m are set to 1. In step S2, column k is activated. In step S3, row m is connected to an ADC for digitizing. In step S4, a comparison is done. If the current row is not the last row of the array, then move to the next row and return to step S3. If it is the last row of the array, then check to determine whether all columns have been processed in step S5. If all columns have not been processed, then set the row counter to 1, move to the next column, and return to step S3. The process ends when all rows and columns have been accounted for.

The foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. A photovoltaic array comprising;
   a plurality of dynamically configurable photovoltaic cells, wherein each of the photovoltaic cells in the photovoltaic array is configured to absorb photons present in light,
   wherein each of the photovoltaic cells in the photovoltaic array is coupled to a set of switches, and
   wherein, based at least one setting of the switches, a first portion of the photovoltaic cells is dynamically configured for energy conversion and a second portion of the photovoltaic cells is configured for imaging.

2. The photovoltaic array of claim 1, wherein the photovoltaic array is coupled to a row address decoder and a column address decoder.

3. The photovoltaic array of claim 2, wherein the row address decoder is configured to select any of the photovoltaic cells in the photovoltaic array according to a row address signal.

4. The photovoltaic array of claim 2, wherein the column address decoder is configured to select any of the photovoltaic cells according to a column address signal.

5. An imager, comprising:
   an array of photovoltaic cells, wherein each photovoltaic cell is divided into at least one pixel along an array of pixels; and
   a set of switches coupled to each photovoltaic cell, wherein each photovoltaic cell is configured to absorb photons present in light, and
   wherein, based on at least one setting of at least one of the switches, a first portion of the photovoltaic cells is dynamically configured for imaging and a second portion of the photovoltaic cells is configured for energy conversion.

6. The imager of claim 5, wherein the set of switches includes a first, second, and third switch.

7. The imager of claim 6, wherein the first portion of photovoltaic cells is dynamically configured for imaging when the first and second switches are set, and wherein the second portion of the photovoltaic cells is dynamically configured for energy conversion when the third switch is set.

8. The imager of claim 5, further comprising:
   a row address decoder, configured to select any of the photovoltaic cells according to a row address signal; and
   a column address decoder, configured to select any of the photovoltaic cells according to a column address signal.

9. The imager of claim 5, further comprising a direct current/direct current (DC/DC) converter configured to accept the converted energy as a direct current.

10. A method for providing an imager, comprising:
    providing an array of photovoltaic cells, wherein each photovoltaic cell is divided into an array of pixels; and
    providing a set of switches coupled to each photovoltaic cell, wherein each photovoltaic cell is configured to absorb photons present in light, and
    wherein, based on at least one setting of at least one of the switches, a first portion of the photovoltaic cells is dynamically configured for imaging an a second portion of the photovoltaic cells is dynamically configured for energy conversion based on the settings of at least one of the switches.

11. The method of claim 10, wherein the set of switches includes a first, second, and third switch.

12. The method of claim 11, wherein the photovoltaic cell is dynamically configured for imaging when the first and second switches are set, and wherein the second portion of the photovoltaic cells is dynamically configured for energy conversion when the third switch is set.

13. The method of claim 10, further comprising:
    providing a row address decoder, configured to select any of the photovoltaic cells according to a row address signal; and
    providing a column address decoder, configured to select any of the photovoltaic cells according to a column address signal.

* * * * *